United States Patent
Zhao et al.

(10) Patent No.: US 11,552,059 B2
(45) Date of Patent: Jan. 10, 2023

(54) LED DISPLAY SCREEN WITH ROTATED LED MODULES

(71) Applicant: Shenzhen Galaxypixel Electronics Co., Ltd., GuangDong (CN)

(72) Inventors: Ligang Zhao, GuangDong (CN); Guangming Song, GuangDong (CN); Youhe Zhang, GuangDong (CN); Jie Zhou, GuangDong (CN); Lei Liang, GuangDong (CN)

(*) Notice: Subject to any disclaimer, the term of this patent is extended or adjusted under 35 U.S.C. 154(b) by 138 days.

(21) Appl. No.: 17/092,350

(22) Filed: Nov. 9, 2020

(65) Prior Publication Data

US 2022/0093574 A1 Mar. 24, 2022

(30) Foreign Application Priority Data

Sep. 18, 2020 (CN) .......................... 202010989929.7

(51) Int. Cl.
 *H01L 27/15* (2006.01)
 *H01L 29/26* (2006.01)
 *H01L 31/12* (2006.01)
 *H01L 33/00* (2010.01)
 *H01L 25/075* (2006.01)
 *H01L 33/62* (2010.01)

(52) U.S. Cl.
 CPC .......... *H01L 25/0753* (2013.01); *H01L 33/62* (2013.01); *H01L 2933/0066* (2013.01)

(58) Field of Classification Search
 CPC ................. H01L 25/0753; H01L 33/62; H01L 2933/0066; H01L 25/13; G09F 9/302; G09F 9/33
 See application file for complete search history.

(56) References Cited

U.S. PATENT DOCUMENTS

| | | | | |
|---|---|---|---|---|
| 7,806,558 | B2* | 10/2010 | Williamson | ....... G03B 21/2013 |
| | | | | 362/249.02 |
| 2005/0099317 | A1* | 5/2005 | Pederson | ................. B60Q 7/00 |
| | | | | 340/815.45 |
| 2008/0123057 | A1* | 5/2008 | Williamson | .......... F21V 7/0091 |
| | | | | 353/30 |
| 2009/0059565 | A1* | 3/2009 | Bertram | .................... G09F 9/33 |
| | | | | 362/231 |
| 2019/0285942 | A1* | 9/2019 | Liu | .................... G02F 1/133605 |
| 2020/0219856 | A1* | 7/2020 | Chang | ................. H01L 25/0753 |
| 2022/0029060 | A1* | 1/2022 | Park | ....................... H01L 33/387 |
| 2022/0102321 | A1* | 3/2022 | Zhao | ........................ H01L 33/62 |

FOREIGN PATENT DOCUMENTS

CN 211479566 U * 9/2020

* cited by examiner

*Primary Examiner* — Ismail A Muse
(74) *Attorney, Agent, or Firm* — Prakash Nama; Global IP Services, PLLC

(57) ABSTRACT

The present invention discloses an LED display screen layout method, including an LED display screen, wherein the LED display screen is formed by splicing a plurality of LED modules; each LED module includes four tricolored LED lamps; the four tricolored LED lamps form a square; and the four tricolored LED lamps are arranged in directions formed by sequentially rotating one of the tricolored LED lamps by 90 degrees. With such layout design, when the LED display screen is rotated, no blue line appears at neighboring borders of the LED modules, thus not influencing the display effect of the display screen.

4 Claims, 4 Drawing Sheets

LED DISPLAY SCREEN WITH ROTATED LED MODULES

BACKGROUND OF THE INVENTION

The present invention relates to the field of LED display screens, and more particularly to an LED display screen layout method.

Light emitting diode (LED) was invented in 1962; in nearly 40 years, the color of the LED developed from the early red, yellow and green to three primary colors red, green and blue at present, and the packaging form also developed from the early in-line single lamp, the later matrix module to the patch three-in-one full-color LED at present.

The layout of the three-in-one full-color LED display screen at present is the uniform arrangement and layout of a tricolored LED; such layout design is simple, and the production process is also comparatively simple. However, when a screen body of the LED display screen needs to rotate and splice modules, blue lines would appear at neighboring borders of the rotated modules because the arrangement directions of the LED lamps on the modules are consistent, thereby influencing the display effect of the display screen. In order to solve the blue line problem, the conventional design method needs to design and produce four different LED display modules, and then splices the LED display modules, which will greatly improve design and production cost.

BRIEF SUMMARY OF THE INVENTION

The present invention provides an LED display screen layout method, and solves the problem that in the existing tricolored LED display screen layout design, blue lines would appear at the neighboring borders of the rotated modules, and influence the display effect of the display screen.

In order to solve the above technical problem, the technical solution of the present invention is: an LED display screen layout method, including an LED display screen, wherein the LED display screen is formed by splicing a plurality of LED modules; each LED module includes four tricolored LED lamps; the four tricolored LED lamps form a square; and the four tricolored LED lamps are arranged in directions formed by sequentially rotating one of the tricolored LED lamps by 90 degrees.

Preferably, the LED modules on the LED display screen are all pluggable and detachable.

Preferably, the four tricolored LED lamps on each LED module are fixedly connected.

Preferably, the four tricolored LED lamps on each LED module are fixedly connected by means of welding.

Preferably, each LED module can be mounted without distinguishing front and back faces after being unplugged and detached.

The present invention achieves the following beneficial effects: (1) in the LED display screen layout method of the present invention, the LED display screen is formed by splicing a plurality of LED modules; each LED module includes four tricolored LED lamps; the four tricolored LED lamps form a square; and the four tricolored LED lamps are arranged in directions formed by sequentially rotating one of the tricolored LED lamps by 90 degrees. With such layout design, when the LED display screen is rotated, no blue line appears at a neighboring border of the LED modules, thus not influencing the display effect of the display screen; and (2) in the LED display screen layout method of the present invention, each LED module is detachable, is simple to replace when damaged, and can be mounted by means of plugging without distinguishing front and back faces.

Figure 1:
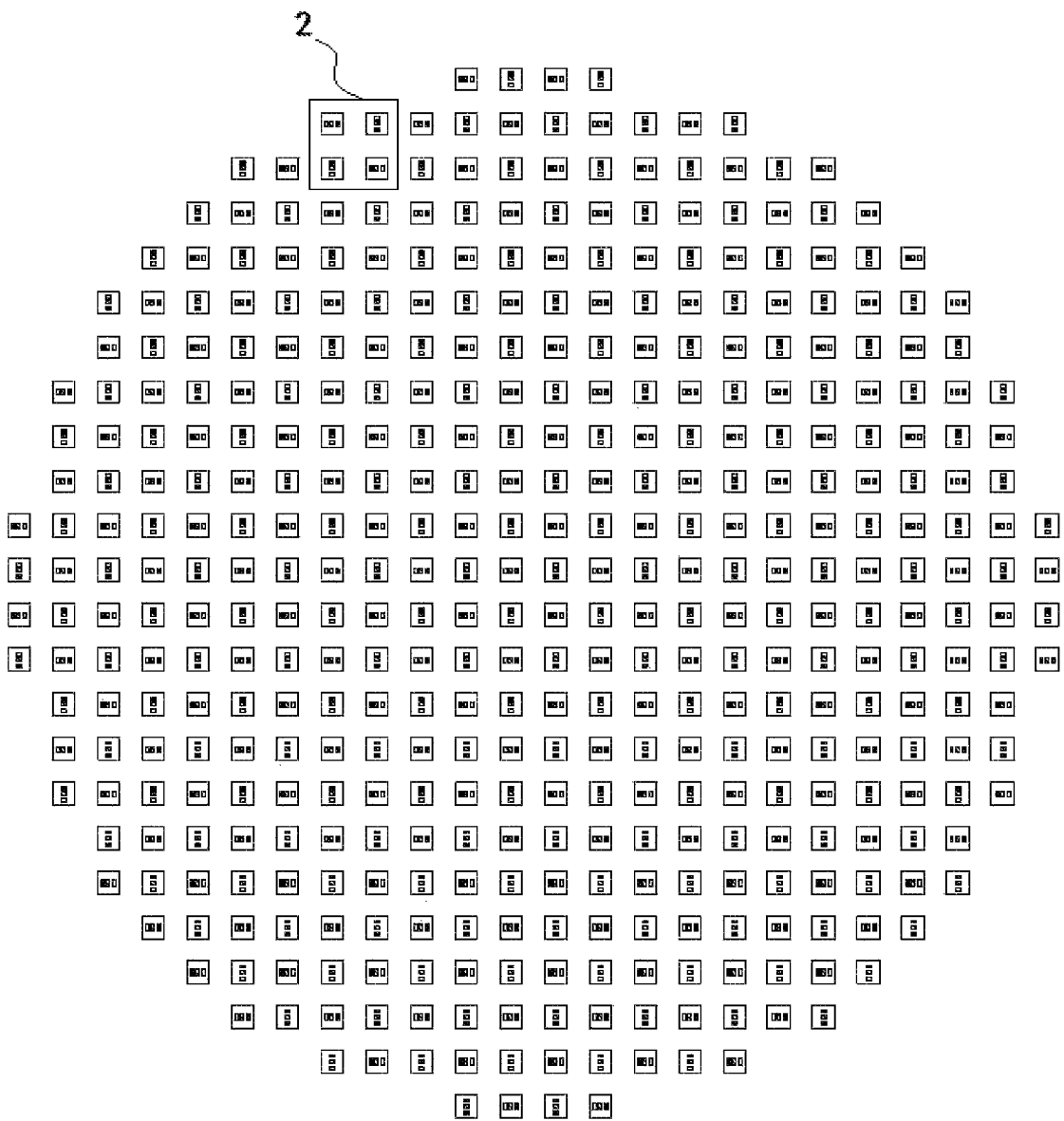
FIG. 1 is a partially enlarged plan view of the LED display screen during rotation according to the LED display screen layout method of the present invention.

In the figures, the numbers or letters represent the names of corresponding components or the name of the flow: 1, LED display screen; 2, LED module; 3, tricolored LED lamp.

The accompanying drawings are merely for exemplary description and cannot be understood as limits to the present invention. In order to better describe an embodiment, some components in the drawings may be omitted, amplified or zoomed out and do not represent the size of an actual product. For a person skilled in the art, it may be understandable that some well-known structures and descriptions may be omitted in the drawings. Same or similar numerals correspond to same or similar components. Terms for describing a positional relationship in the drawings are merely for exemplary description and cannot be understood as limits to the present invention.

DETAILED DESCRIPTION OF THE INVENTION

Figure 2:
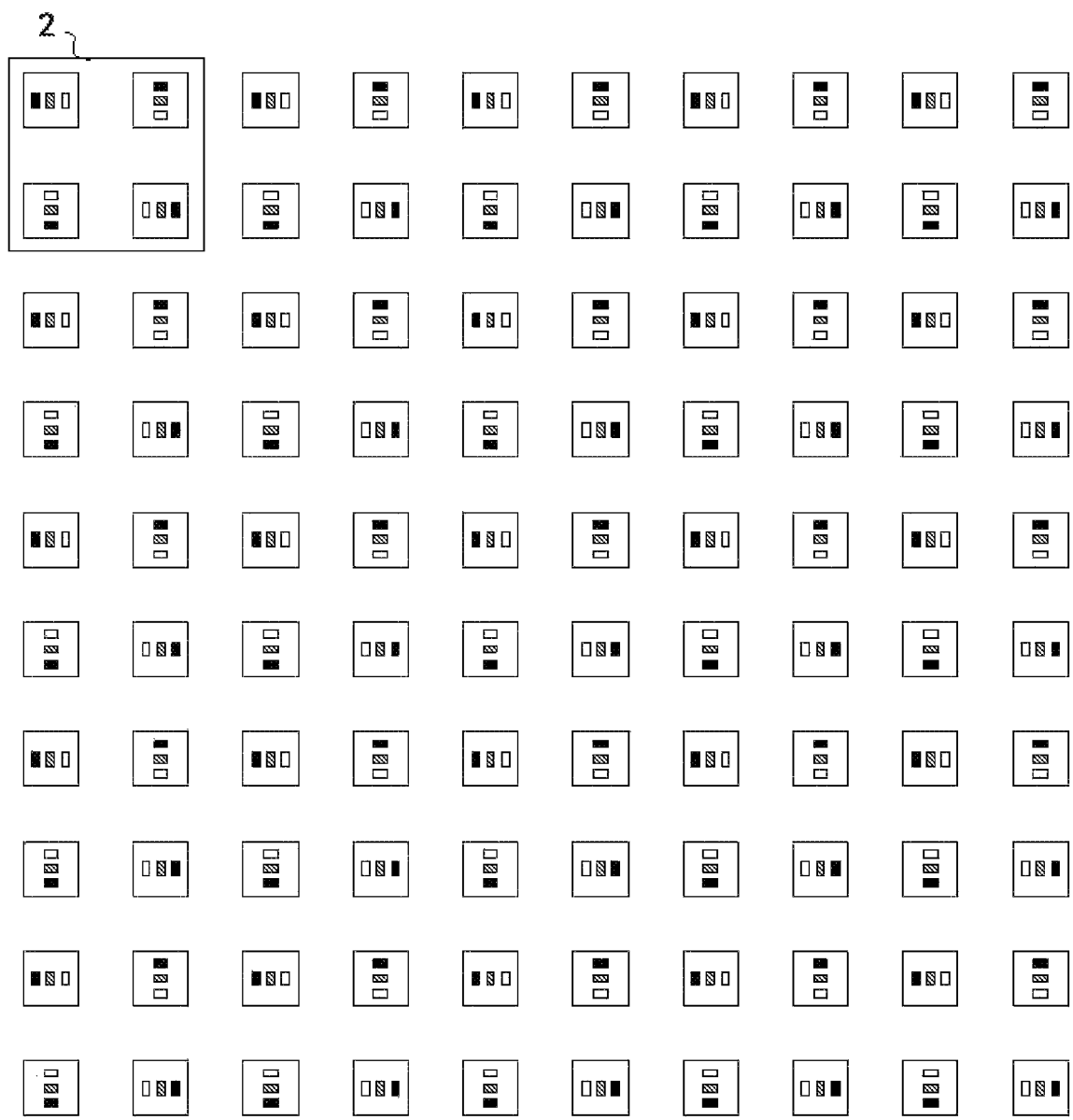
FIG. 2 is an enlarged arrangement view of each LED lamp and each LED module of the LED display screen according to the LED display screen layout method of the present invention.
Figure 3:
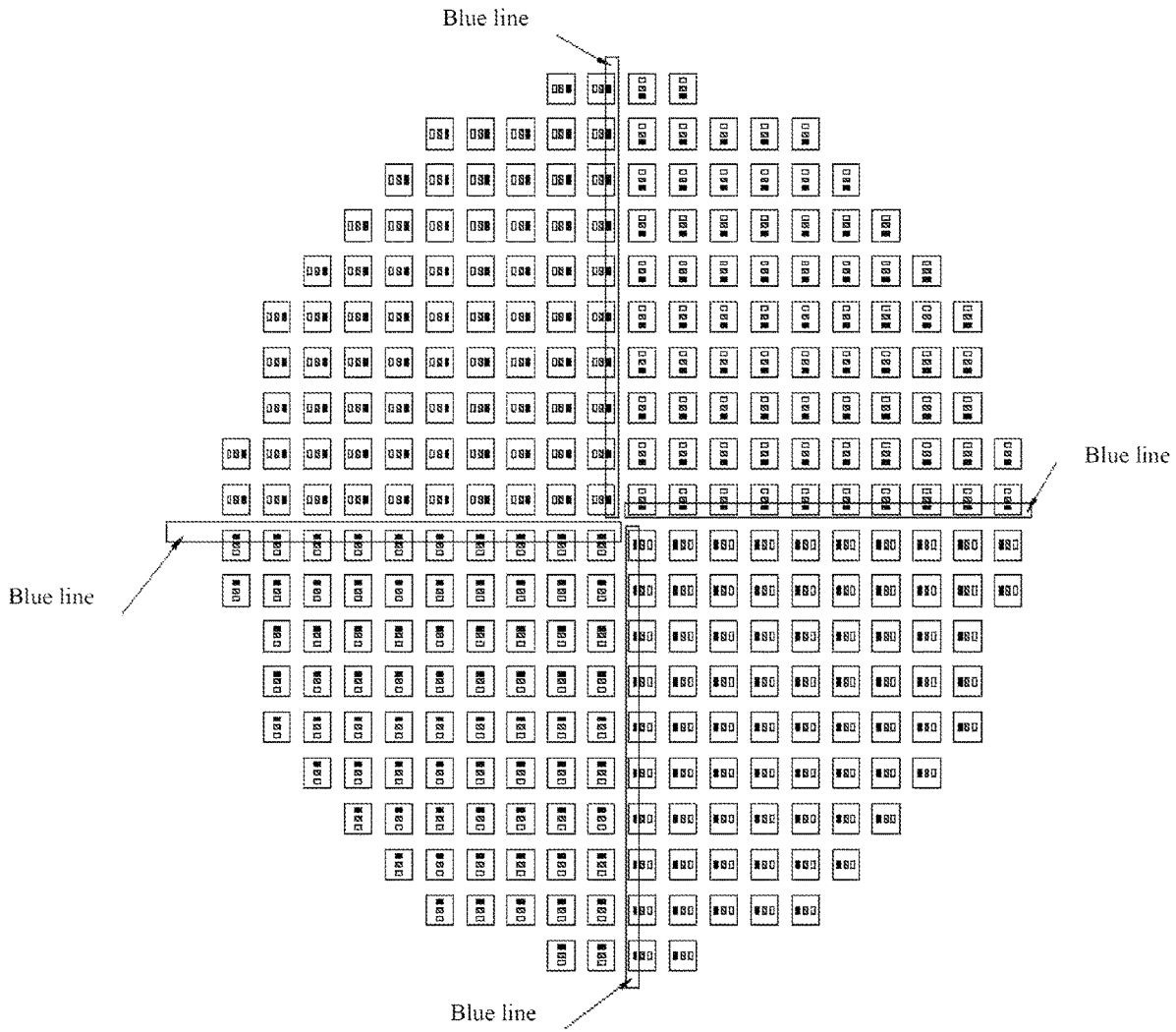
FIG. 3 is a partially enlarged plan view of the LED display screen during rotation according to the conventional LED display screen layout method, wherein blue lines appear at the positions circled by blocks in the middle, and influence the display effect of the display screen.
Figure 4:
FIG. 4 is an overall schematic view and exploded view of the LED display screen, and an enlarged arrangement view of each LED module and each LED lamp.
Figure 5:
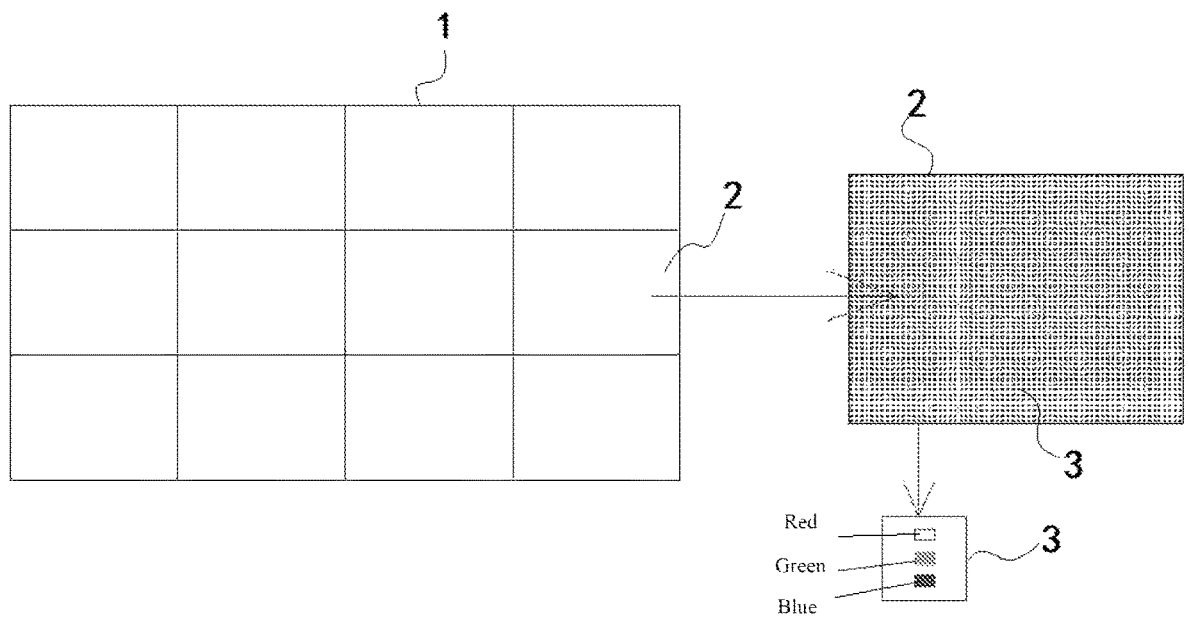
FIG. 5 is a flow chart of the LED display screen.

To facilitate the understanding of a person skilled in the art, the present invention will be further described in detail hereafter in combination with the drawings and an embodiment. The embodiment is specifically described as follows:

As shown in FIGS. 1, 2 and 5, an LED display screen layout method, comprising an LED display screen 1, wherein the LED display screen 1 is formed by splicing a plurality of LED modules 2; each LED module 2 includes four tricolored LED lamps 3; each tricolored LED lamp consists of three light emitting diodes in three colors red, green and blue; as circled by the blocks in FIGS. 1 and 2, each block is an LED module; the four tricolored LED lamps 3 form a square; and the four tricolored LED lamps 3 are arranged in directions formed by sequentially rotating one of the tricolored LED lamps 3 by 90 degrees, as shown in FIG. 2. With such layout design in the embodiment, when the LED display screen is rotated, no blue line appears at neighboring borders of the LED modules, thus not influencing the display effect of the display screen. However, blue lines would appear in a conventional display screen; as shown in FIG. 4, in the conventional display screen, the tricolored LED lamps in each LED module are arranged in the same directions; furthermore, as shown in FIG. 3, blue lines appear at the positions circled by blocks in the middle, and influence the display effect of the display screen.

Specifically, the LED modules 2 on the LED display screen 1 are all pluggable and detachable, and the four tricolored LED lamps 3 on each LED module 2 are fixedly connected. In the embodiment, each LED module 2 can be mounted without distinguishing front and back faces after being unplugged and detached, and the four tricolored LED lamps on each LED module 2 are fixedly connected by means of welding. Each LED module is detachable, and is simple to replace when damaged.

Apparently, the above embodiments of the present invention are merely examples to describe the present invention clearly and are not intended to limit the implementation manners of the present invention. A person of ordinary skill in the art may further make other changes or variations in a different form on the basis of the above description. Herein, examples are unnecessarily provided for all implementation manners. Any modification, equivalent replacement, improvement and the like made within the spirit and principle of the present invention should be included in a scope of protection of the claims of the present invention.

What is claimed is:

1. An LED display screen with rotated LED modules, comprising an LED display screen (1), wherein the LED display screen (1) is formed by splicing a plurality of LED modules (2); each LED module (2) comprises four tricolored LED lamps (3); the four tricolored LED lamps (3) form a square; and the four tricolored LED lamps (3) are arranged in directions formed by sequentially rotating one of the tricolored LED lamps (3) by 90 degrees;

the four tricolored LED lamps (3) on each LED module (2) are fixedly connected;

each LED module (2) is mounted by plugging without distinguishing front and back faces.

2. The LED display screen with rotated LED modules according to claim 1, wherein the LED modules (2) are all detachable.

3. The LED display screen with rotated LED modules according to claim 1, wherein the four tricolored LED lamps (3) on each LED module (2) are fixedly connected by welding.

4. The LED display screen with rotated LED modules according to claim 2, wherein the four tricolored LED lamps (3) on each LED module (2) are fixedly connected by welding.

* * * * *